US010659015B2

(12) United States Patent
Liles et al.

(10) Patent No.: US 10,659,015 B2
(45) Date of Patent: May 19, 2020

(54) METHOD, APPARATUS, AND SYSTEM FOR A LEVEL SHIFTING LATCH WITH EMBEDDED LOGIC

(71) Applicant: QUALCOMM Incorporated, San Diego, CA (US)

(72) Inventors: Stephen Liles, Apex, NC (US); Jared Buckner, Fuquay Varina, NC (US)

(73) Assignee: QUALCOMM Incorporated, San Diego, CA (US)

( * ) Notice: Subject to any disclaimer, the term of this patent is extended or adjusted under 35 U.S.C. 154(b) by 43 days.

(21) Appl. No.: 15/987,936

(22) Filed: May 24, 2018

(65) Prior Publication Data

US 2019/0363700 A1 Nov. 28, 2019

(51) Int. Cl.
*H03K 3/356* (2006.01)
*H03K 3/012* (2006.01)

(52) U.S. Cl.
CPC . *H03K 3/356069* (2013.01); *H03K 3/356165* (2013.01); *H03K 3/012* (2013.01)

(58) Field of Classification Search
None
See application file for complete search history.

(56) References Cited

U.S. PATENT DOCUMENTS

| | | | | |
|---|---|---|---|---|
| 8,004,307 B2* | 8/2011 | Masleid | ........... | H03K 19/01852 326/21 |
| 8,030,960 B2* | 10/2011 | Masleid | ................ | H04L 25/20 326/23 |
| 8,773,166 B1* | 7/2014 | Gaide | .............. | H03K 19/01707 326/38 |
| 2005/0225355 A1 | 10/2005 | Kuang et al. | | |
| 2007/0268056 A1 | 11/2007 | Nakamura | | |
| 2010/0164578 A1* | 7/2010 | Masleid | ................ | H03K 3/012 327/165 |
| 2011/0285431 A1 | 11/2011 | Tang et al. | | |
| 2012/0139600 A1* | 6/2012 | Hwang | ................. | H03K 3/012 327/203 |
| 2016/0283142 A1 | 9/2016 | Rabe | | |

OTHER PUBLICATIONS

International Search Report and Written Opinion—PCT/US2019/027778—ISA/EPO—dated Jul. 11, 2019.

* cited by examiner

*Primary Examiner* — Lincoln D Donovan
*Assistant Examiner* — Khareem E Almo
(74) *Attorney, Agent, or Firm* — Qualcomm Incorporated

(57) ABSTRACT

In certain aspects of the disclosure, an apparatus comprises a latching element having a data input, a first feedback input, a second feedback input, and an output. A pull-up input block is coupled to the data input and has at least a first pull-up input, and a pull-down input block is also coupled to the data input and has at least a first pull-down input. A feedback pull-down block implementing a logic function complementary to the pull-up input block is coupled to a feedback pull-down control device and responsive to the first pull-up input, and a feedback pull-up block implementing a logic function complementary to the pull-down input block is coupled to a feedback pull-up control device and responsive to the first pull-down input. The pull-up input block and pull-down input block are guaranteed not to be enabled concurrently.

8 Claims, 5 Drawing Sheets

METHOD, APPARATUS, AND SYSTEM FOR A LEVEL SHIFTING LATCH WITH EMBEDDED LOGIC

BACKGROUND

Field

Aspects of the present disclosure relate generally to latch circuits, and more specifically to a level-shifting set-reset (S-R) latch with embedded logic.

Background

Achieving timing closure when designing integrated circuits (such as processors) is a challenging problem, and involves many trade-offs between circuit power, performance, area, and other considerations. Latch circuits may be employed to capture and hold data as part of such an integrated circuit. Guaranteeing that clock signals that control the latch circuits and data signals that are captured by the latch have the appropriate timing relative to each other such that data is properly captured and retained can be particularly challenging where some of those signals are naturally offset with respect to each other as a result of the design of the surrounding circuits which generate those signals.

Further, such integrated circuits may be designed with multiple voltage domains, and voltage level shifting circuits may be employed to allow signals to move between those voltage domains. Where some of the signals feeding the latch circuit are at different voltages than other signals feeding the latch circuit, the complexity of the timing problem increases, and may lead a circuit designer to make otherwise undesirable tradeoffs such as lowering the design frequency and increasing the design area to add additional circuits to control the relative timing of the signals feeding the latch circuit.

It would thus be desirable to latch circuit with less complex timing parameters, while maintaining sufficient performance and optimizing the power and area of the latch circuit.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In one aspect, an apparatus comprises a latching element having a data input, a first feedback input, a second feedback input, and an output. The apparatus further comprises a pull-up input block coupled to the data input of the latching element and having at least a first pull-up input and a pull-down input block coupled to the data input of the latching element having at least a first pull-down input. The apparatus further comprises a feedback pull-down block coupled to a feedback pull-down control device, the feedback pull-down block responsive to the first pull-up input and implementing an opposite logic function to the pull-up input block and a feedback pull-up block coupled to a feedback pull-up control device, the feedback pull-up block responsive to the first pull-down input and implementing an opposite logic function to the pull-down input block. The pull-up input block and the pull-down input block are configured not to be enabled concurrently.

In another aspect, an apparatus comprises means for latching having a data input, a first feedback input, a second feedback input, and an output. The apparatus further comprises means for pull-up coupled to the data input of the means for latching and having at least a first pull-up input and means for pull-down coupled to the data input of the means for latching and having at least a first pull-down input. The apparatus further comprises means for feedback pull-down coupled to a means for controlling feedback pull-down, the means for feedback pull-down responsive to the first pull-up input and implementing an opposite logic function to the means for pull-up; and means for feedback pull-up coupled to a means for controlling feedback pull-up, the means for feedback pull-up responsive to the first pull-down input and implementing an opposite logic function to the means for pull-down. The means for pull-up and the means for pull-down are configured not to be enabled concurrently In another aspect, a method comprises enabling either a pull-up input block or a pull-down input block feeding a data input of a latching element, the pull-up input block and the pull-down input block configured not to be enabled concurrently, the pull-up input block having an associated feedback pull-down block that implements a logic function complementary to the pull-up input block, the pull-down input block having an associated feedback pull-up block that implements a logic function complementary to the pull-down input block. The method further comprises disabling the feedback block associated with the enabled input block. The method further comprises disabling the previously enabled input block and enable the associated feedback block.

One advantage of one or more disclosed aspects is that the disclosed aspects allow for certain logic functions to be embedded into a level-shifting set-reset latch. This conserves silicon area and improves the performance of the latch.

DETAILED DESCRIPTION

Aspects of the inventive teachings herein are disclosed in the following description and related drawings directed to specific aspects. Alternate aspects may be devised without departing from the scope of the inventive concepts herein. Additionally, well-known elements of the environment may not be described in detail or may be omitted so as not to obscure the relevant details of the inventive teachings herein.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Figure 1:
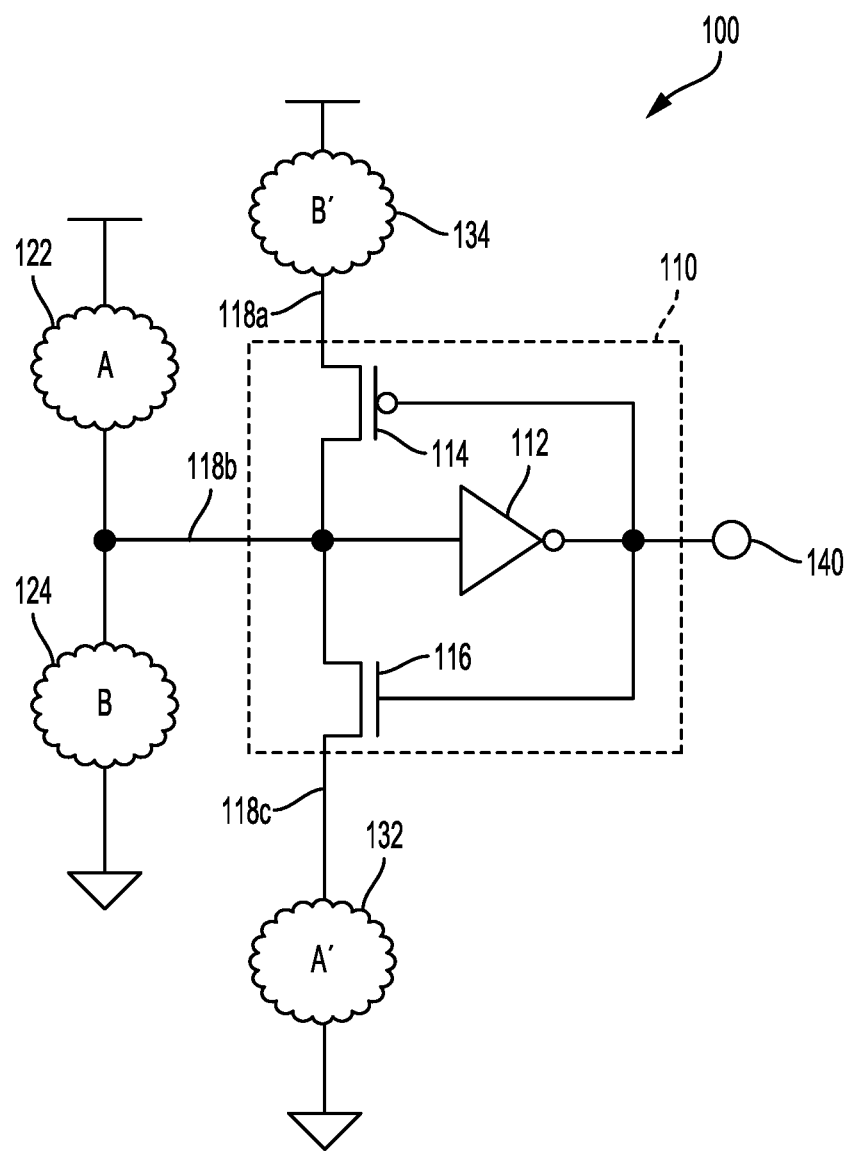
FIG. 1 shows a diagram of a generalized latch circuit according to certain aspects of the present disclosure.

In this regard, in one aspect, FIG. 1 shows a diagram of a generalized latch circuit 100 according to certain aspects of the present disclosure as described herein. The latch circuit 100 comprises a latching element 110, a pull-up input block 122, a pull-down input block 124, a feedback pull-down block 132, a feedback pull-up block 134, and a latch output 140. The latching element 110 comprises an inverter 112 coupled to a pull-up feedback control device 114 and a pull-down feedback control device 116. The input of the inverter 112 is coupled to the outputs of pull-up feedback control device 114, pull-down feedback control device 116, pull-up input block 122, and pull-down input block 124. The output of the inverter 112 is coupled to the gate inputs of pull-up feedback control device 114 and pull-down feedback control device 116 and to the latch output 140. The pull-up input block 122 and the pull-down input block 124 are coupled to a data input 118b of the latching element 110. The feedback pull-up block 134 is coupled to a first feedback input 118a of the latching element 110, and the feedback pull-down block 132 is coupled to a second feedback input 118c of the latching element 110.

The pull-up input block 122 may receive a first set of input signals, and the pull-down input block 124 may receive a second set of input signals. In some aspects, some input signals may be common between the first set of input signals and second set of input signals, while in other aspects, the first set of input signals and the second set of input signals are disjoint. The first set of input signals are further provided to the pull-down feedback block 132, and the second set of input signals are provided to the pull-up feedback block 134.

As will be described further herein, the pull-up input block 122 and the feedback pull-down block 132 implement complementary logic functions with respect to each other, and the pull-down input block 124 and the feedback pull-up input block 134 implement complementary logic functions with respect to each other. This ensures that a complete circuit path from power to ground is not create through the pull-up input block 122 and the feedback pull-down block 132, and through the pull-down input block 124 and the feedback pull-up block 134, respectively.

To further ensure that a direct circuit path from power to ground is not created, the respective logic functions implemented by each input block (function A for pull-up input block 122, function B for pull-down input block 124) must be designed to ensure that pull-up input block 122 and pull-down input block 124 are not both enabled concurrently. Those having skill in the art will recognize that this may be done in different ways, as will be discussed in exemplary aspects with reference to FIGS. 2 and 3. For example, in one aspect the inputs to each block may be chosen such that at least one of the inputs is common between the two logic functions and controls one PMOS transistor coupled in series with a voltage supply and one NMOS transistor coupled in series with ground, such that a complete circuit path from power to ground is logically guaranteed never to occur because the PMOS transistor and NMOS transistor cannot both be turned on concurrently during normal circuit operation (e.g., the input is at either a logic low or logic high value). In another exemplary aspect, the timing of the inputs to each input block may be controlled such that a complete circuit path from power to ground is never created as a result of the relative timing of the inputs.

Those having skill in the art will recognize that signals which are inputs to only the pull-down input block 124 may be level-shifted up from a lower voltage domain to a higher voltage domain (where the inverter 112 is in the higher voltage domain) without the addition of extra circuit elements to support the level-shifting function. This may be accomplished because pull-up feedback control device 114 is controlled by the inverter 112, and therefore even if the feedback pull-up block 134 is only weakly turned off due to the input signals to it coming from the lower voltage domain, the pull-up feedback control device 114 will mitigate any drive fight between the pull-down input block 124 and the feedback pull-up block 134. Thus, the generalized latch circuit 100 may also be employed as a level-shifter between voltage domains if the inputs to the pull-down input block 124 are chosen appropriately.

Figure 2:
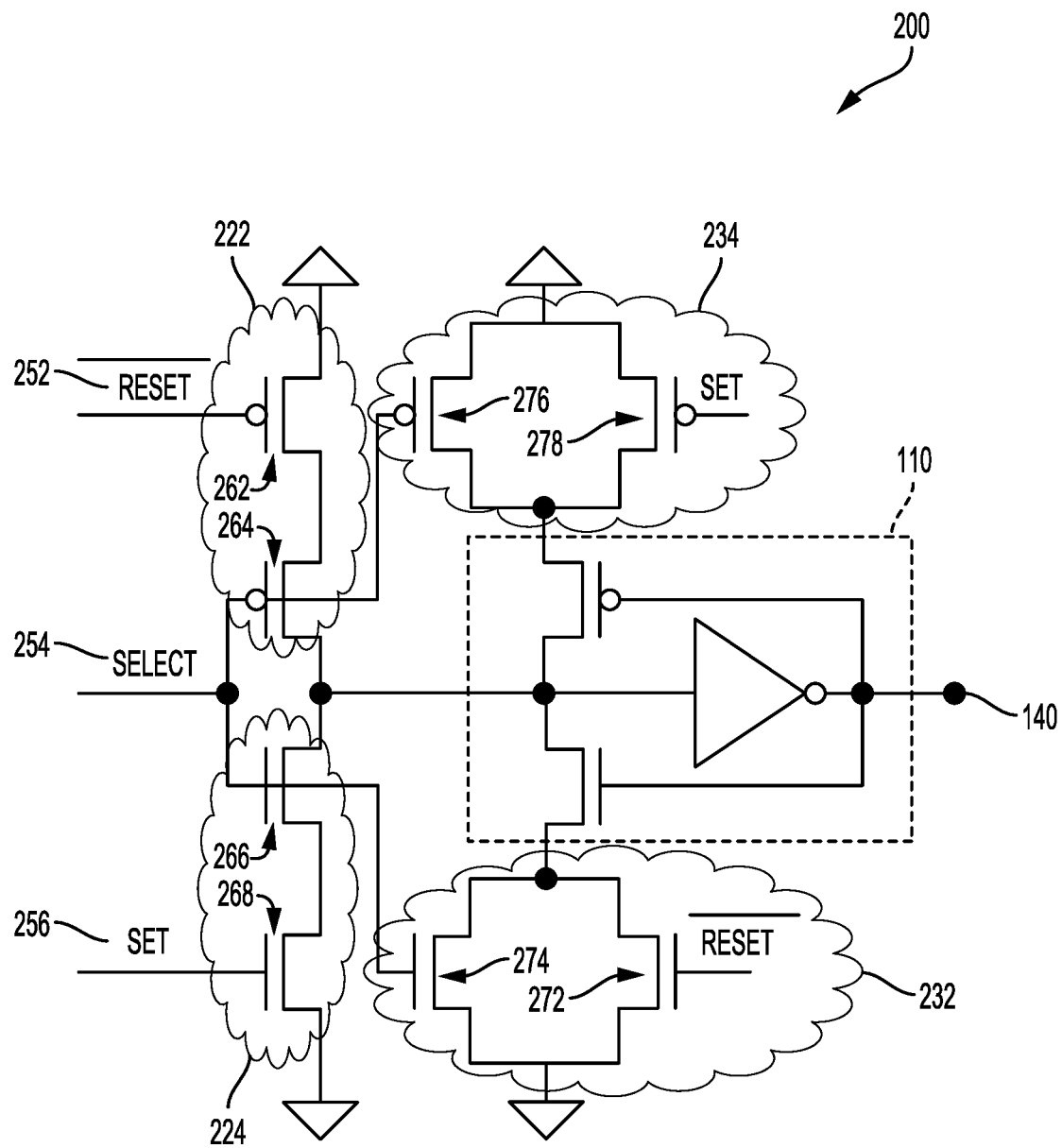
FIG. 2 shows a diagram of a particular set-reset (S-R) latch circuit according to certain aspects of the present disclosure.

In an aspect, FIG. 2 shows a set-reset (S-R) latch circuit 200 designed in accordance with the generalized latch circuit 100 of FIG. 1 and including the latching element 110, a pull-up input block 222, a pull-down input block 224, a feedback pull-down block 232, a feedback pull-up block 234, and the latch output 140. The S-R latch 200 further includes a reset_bar input 252, a select input 254, and a set input 256. As will be described further with respect to FIG. 2, the select input 254 is coupled to both the pull-up input block 222 and the pull-down input block 224 in such a way as to guarantee that a complete circuit path from power to ground will not occur.

Pull-up input block 222 and feedback pull-down block 232 implement logically complementary functions with respect to the reset_bar input 252 and the select input 254.

Pull-up input block 222 is enabled when both the reset_bar input 252 and the select input 254 are logic low (and thus PMOS transistors 262 and 264 are both turned on), whereas the feedback pull-down block 232 is enabled when either either the reset_bar input 252 or the select input 254 are logic high (and thus one or both of NMOS transistors 272 and 274 are turned on). In a similar manner, pull-down input block 224 and feedback pull-up block 234 implement logically complementary functions with respect to the set input 256 and the select input 254. Pull-down input block 224 is enabled when both the set input 256 and the select input 254 are logic high (and thus NMOS transistors 266 and 268 are both turned on), whereas the feedback pull-up block 234 is enabled when either the set input 256 or the select input 254 is logic low (and thus one or both of the PMOS transistor(s) 276 and 278 are turned on). As discussed above, because the select input 254 is used directly as an input to a series-connected transistor in both the pull-up input block 222 and the pull-down input block 224, the pull-up input block 222 and the pull-down input block 224 are logically guaranteed never to be enabled concurrently, and thus a complete circuit path from power to ground is guaranteed not to occur under normal operating conditions.

Figure 3:
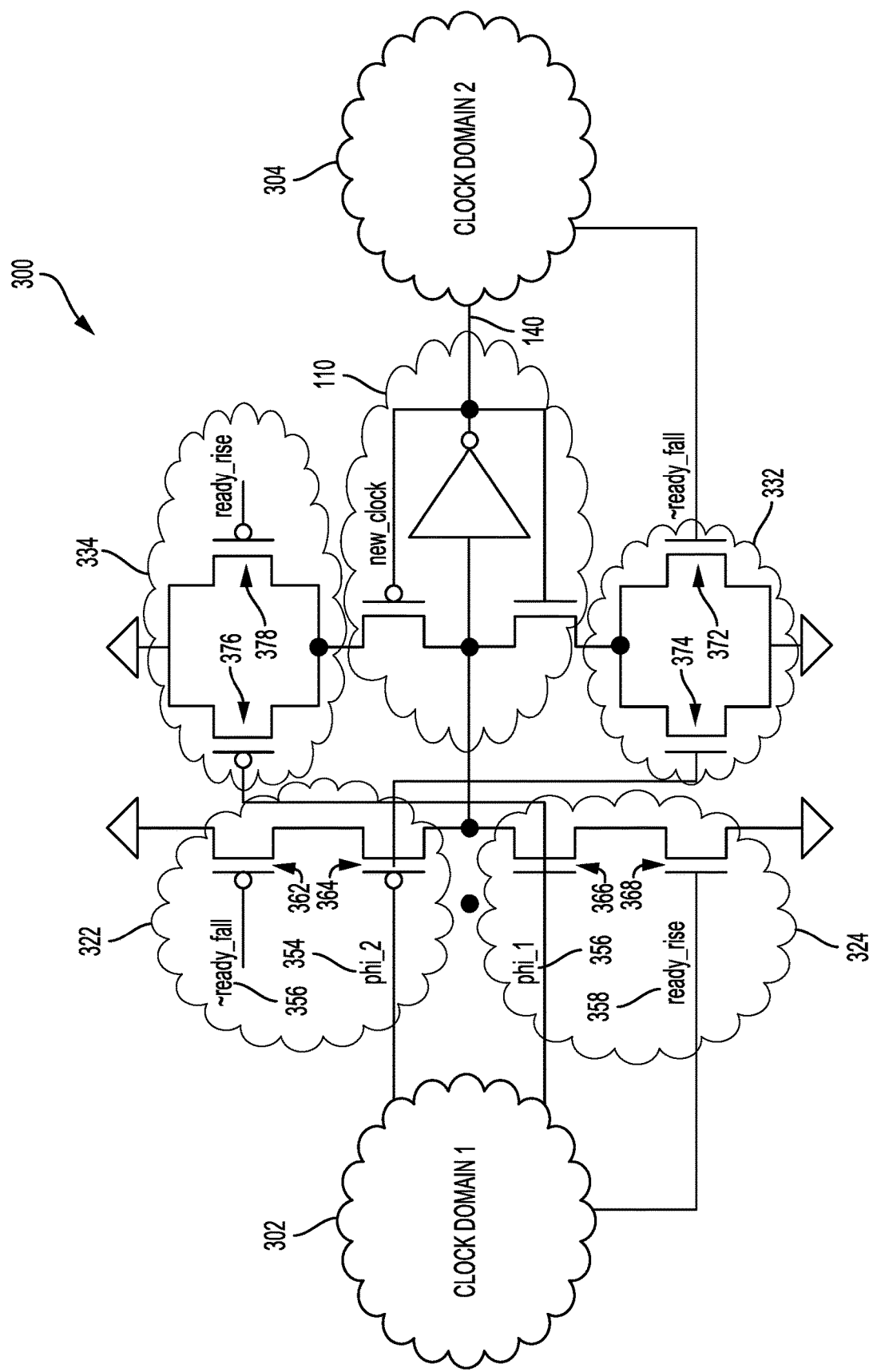
FIG. 3 shows a diagram of a clock edge synchronizer according to certain aspects of the present disclosure.

In another aspect, FIG. 3 shows a clock edge synchronizer circuit 300 designed in accordance with the generalized latch circuit 100 of FIG. 1 and including the latching element 110, a pull-up input block 322, and pull-down input block 324, a feedback pull-down block 332, a feedback pull-up block 334, and the latch output 140. The clock edge synchronizer 300 further includes ready_fall_bar input 352, phi_2 input 354, phi_1 input 356, and read_rise input 358. Phi_1 input 356 and phi_2 input 354 are non-overlapping clock inputs, meaning that the relative timing of the high periods of the phi_1 input 356 and the phi_2 input 354 have been guaranteed (via static timing or other methods known to those having skill in the art) to be non-overlapping. In one aspect, the phi_2 input 354, phi_1 input 356, and ready_rise input 358 may originate in a first clock domain 302, while the ready_fall_bar input 352 may originate in a second clock domain 304.

Pull-up input block 322 and pull-down feedback block 332 implement logically complementary functions with respect to the ready_fall_bar input 352 and the phi_2 input 354. Pull-up input block 322 is enabled when both the ready_fall_bar input 352 and the phi_2 input 354 are logic low (and thus PMOS transistors 362 and 364 are both turned on), whereas the feedback pull-down block 332 is enabled when either the ready_fall_bar input 352 or the phi_2 input 354 are logic high (and thus one or both of the NMOS transistors 372 and 374 are turned on). In a similar manner, pull-down input block 324 and feedback pull-up block 334 implement logically complementary functions with respect to the ready_rise input 358 and the phi_1 input 356. Pull-down input block 324 is enabled when both the ready_rise input 358 and the phi_1 input 356 are logic high (and thus NMOS transistors 368 and 366 are both turned on), whereas the feedback pull-up block 334 is enabled when either the ready_rise input 358 or the phi_1 input 356 is logic low (and thus one or both of the PMOS transistor(s) 376 and 378 are turned on). Because the phi_1 input 356 and the phi_2 input 354 are non-overlapping clock inputs, the pull-up input block 322 and the pull-down input block 324 are guaranteed never to be enabled concurrently, and thus a complete circuit path from power to ground is guaranteed not to occur under normal operating conditions.

Those having skill in the art will recognize that other circuits and logical functions may be realized without departing from the scope of the teachings of the present disclosure. For example, the inputs to the various pull-up input blocks and the inputs to the various pull-down input blocks may originate from the same or from different clock domains. Likewise, they may originate from the same or from different voltage domains (as long as they satisfy the parameters for level-shifting discussed in the context of FIG. 1). The circuits described with respect to FIGS. 2 and 3 are thus exemplary aspects, and not to be understood as limiting of the teachings of the present disclosure.

Figure 4:
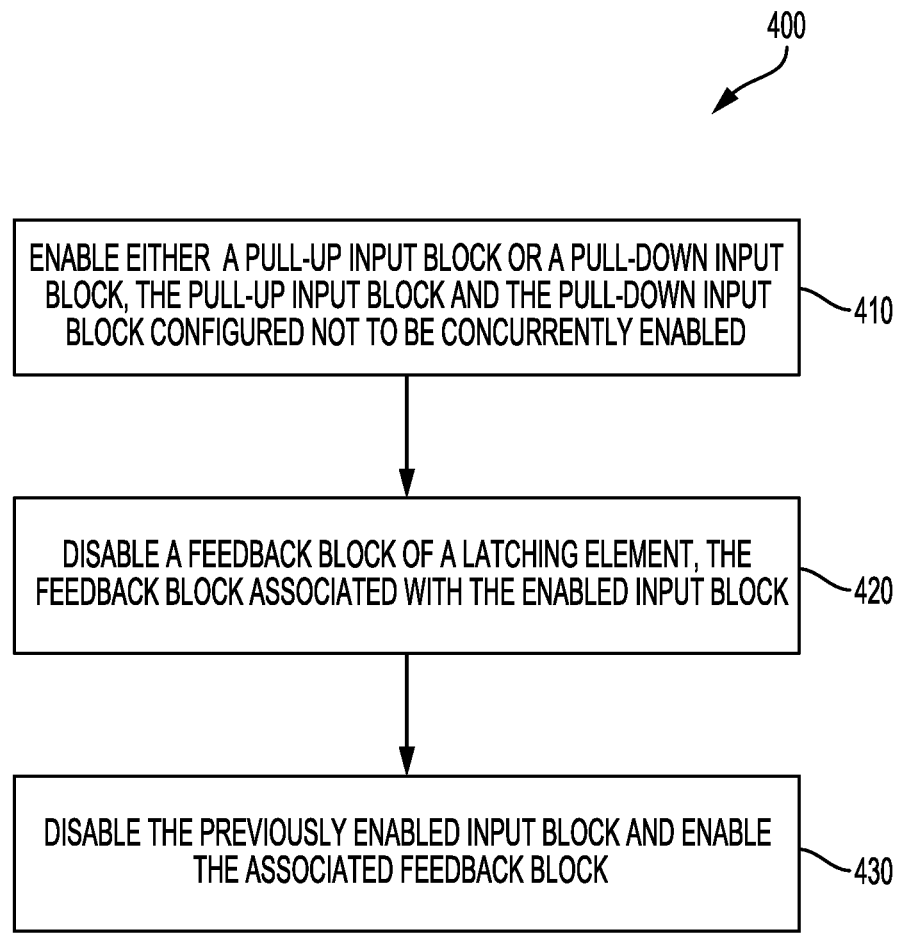
FIG. 4 shows a block diagram of a method of operation of a generalized latch circuit according to certain aspects of the present disclosure.

In another aspect, FIG. 4 shows a block diagram of a method 400 of operation of a generalized latch circuit. The method 400 may apply to the S-R latch 200 of FIG. 2, the clock edge synchronizer circuit 300 of FIG. 3, or any other circuit designed in accordance with the characteristics of the generalized latch circuit 100 of FIG. 1.

The method 400 begins at block 410, where one of either a pull-up input block or a pull-down input block is enabled, wherein the pull-up input block and the pull-down input block are configured not to be concurrently enabled. As described with reference to previous figures, the pull-up input block and the pull-down input block may be configured not to be concurrently enabled by virtue of their logic design, by virtue of the timing relationships of the individual input signals to each of the blocks, or by other methods known to those having skill in the art. For example and with reference to the generalized latch circuit 100 of FIG. 1, the pull-up input block 122 may be enabled while the pull-down input block 124 is disabled.

The method 400 continues at block 420, where a feedback block of a latching element associated with the enabled input block is disabled. Again, for example and with reference to the generalized latch circuit 100 of FIG. 1, the feedback pull-down block 132 associated with the input pull-up block 122 is disabled.

The method continues at block 430, where the previously enabled input block is now disabled, and the associated feedback block is enabled. Again, for example and with reference to the generalized latch circuit 100 of FIG. 1, the pull-up input block 122 is disabled while the feedback pull-down block 132 is enabled.

Figure 5:
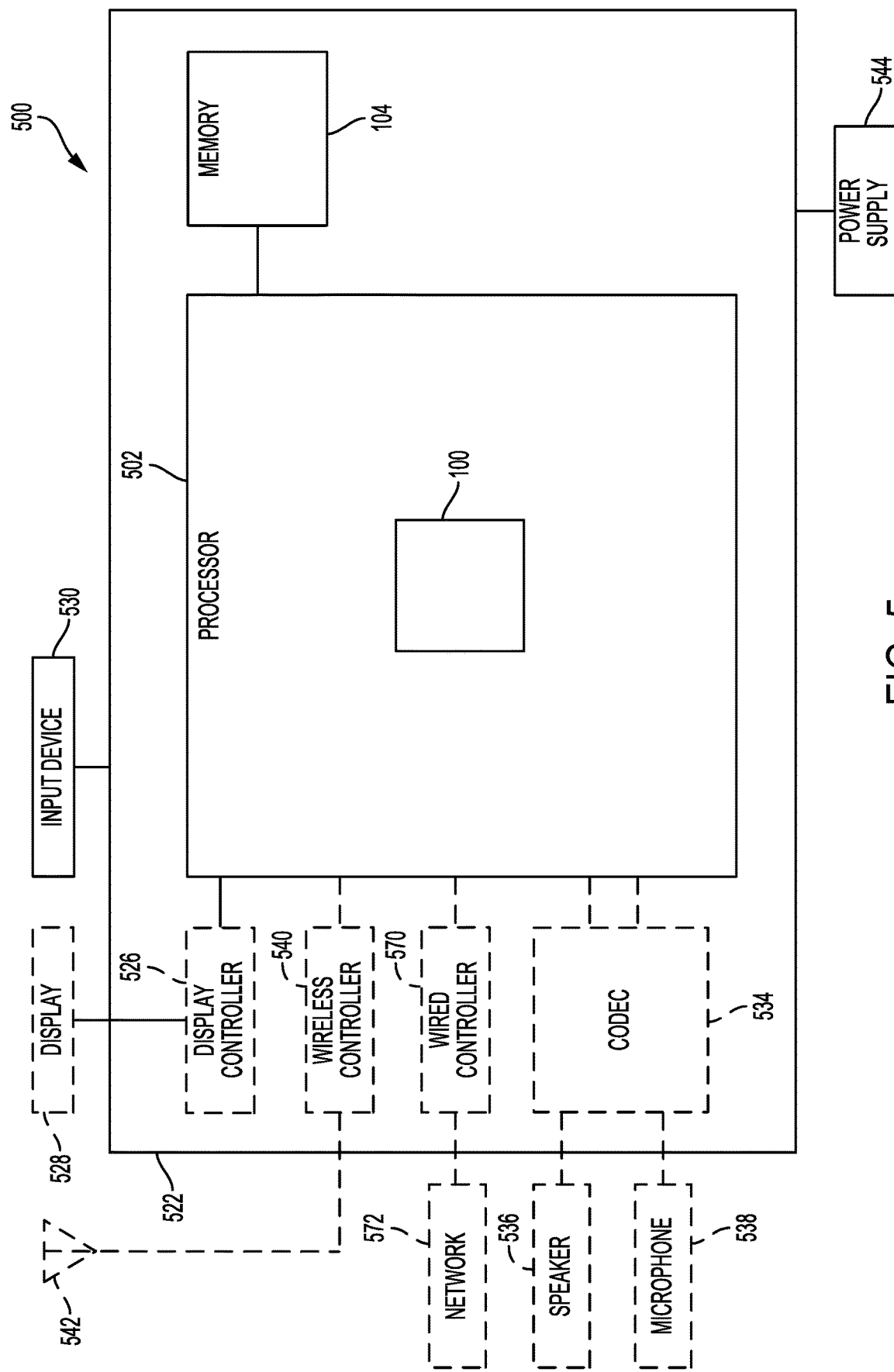
FIG. 5 shows a system-level diagram of a computing device including a latch circuit according to certain aspects of the present disclosure.

An example apparatus in which aspects of this disclosure may be utilized will now be discussed in relation to FIG. 5. FIG. 5 shows a diagram of a computing device 500 incorporating one or more aspects of the generalized latch circuit 100 of FIG. 1. For example, the computing device 500 may include the set-reset latch circuit of FIG. 2, the clock edge synchronizer circuit of FIG. 3, or any other circuit that satisfies the parameters of generalized latch circuit 100. The memory 504 may further store non-transitory computer-readable instructions that, when executed by the processor 102, may perform the method 400 of FIG. 4.

FIG. 5 also shows optional blocks in dashed lines, such as coder/decoder (CODEC) 534 (e.g., an audio and/or voice CODEC) coupled to processor 502 and speaker 536 and microphone 538 can be coupled to CODEC 534; and wireless antenna 542 coupled to wireless controller 540 which is coupled to processor 502. Further, the system 502 also shows display controller 526 that is coupled to processor 502 and to display 528, and wired network controller 570 coupled to processor 502 and to a network 572. Where one or more of these optional blocks are present, in a particular aspect, processor 502, display controller 526, memory 532, and wireless controller 540 may be included in a system-in-package or system-on-chip device 522.

Accordingly, a particular aspect, input device 530 and power supply 544 are coupled to the system-on-chip device 522. Moreover, in a particular aspect, as illustrated in FIG. 5, where one or more optional blocks are present, display 528, input device 530, speaker 536, microphone 538, wireless antenna 542, and power supply 544 are external to the system-on-chip device 522. However, each of display 528, input device 530, speaker 536, microphone 538, wireless antenna 542, and power supply 544 can be coupled to a component of the system-on-chip device 522, such as an interface or a controller.

It should be noted that although FIG. 5 generally depicts a computing device, processor 502 and memory 504, may also be integrated into a mobile phone, a communications device, a computer, a server, a laptop, a tablet, a personal digital assistant, a music player, a video player, an entertainment unit, and a set top box, or other similar devices.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include a computer readable media embodying a method for operating a generalized latch circuit as described with respect to FIG. 4. Thus, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. An apparatus, comprising:
   a latching element having a data input, a first feedback input, a second feedback input, and an output;
   a pull-up input block coupled to the data input of the latching element and having at least a first pull-up input;
   a pull-down input block coupled to the data input of the latching element and having at least a first pull-down input;
   a feedback pull-down block coupled to a feedback pull-down control device, the feedback pull-down block responsive to the first pull-up input and implementing an opposite logic function to the pull-up input block;
   a feedback pull-up block coupled to a feedback pull-up control device, the feedback pull-up block responsive to the first pull-down input and implementing an opposite logic function to the pull-down input block; and
   a set-reset latch, wherein:
   the pull-up input block and the pull-down input block are configured not to be enabled concurrently,
   the feedback pull-down control device and the feedback pull-up control device are controlled by the output,
   the pull-up input block further has a second pull-up input and the feedback pull-down block is further responsive to the second pull-up input,
   the pull-down input block further has a second pull-down input and the feedback pull-up block is further responsive to the second pull-down input,
   the first pull-up input of the pull-up input block is a not_reset input, the first pull-down input of the pull-down input block is a set input, and
   the second pull-up input and the second pull-down input are coupled together as a select input.

2. The apparatus of claim 1, wherein the first pull-up input and the first pull-down input are logically complementary.

3. The apparatus of claim 1, wherein a relative timing of the first pull-up input and the first pull-down input is configured to ensure that the pull-up input block and the pull-down input block are not enabled concurrently.

4. The apparatus of claim 1, wherein the first pull-up input originates in a first voltage domain and the first pull-down input originates in a second voltage domain.

5. The apparatus of claim 4, wherein the feedback pull-up block is configured to be decoupled from the data input in response to a control signal from the first voltage domain.

6. The apparatus of claim 1, wherein the apparatus comprises a clock edge synchronizer, and wherein:
   the first pull-up input of the pull-up input block is a not_ready_fall input;
   the second pull-up input of the pull-up input block is a clock_2 input;
   the first pull-down input of the pull-down input block is a ready_rise input;
   the second pull-down input of the pull-down input block is a clock_1 input.

7. The apparatus of claim 1, integrated into a computing device.

8. The apparatus of claim 7, the computing device further integrated into a device selected from the group consisting of a mobile phone, a communications device, a computer, a server, a laptop, a tablet, a personal digital assistant, a music player, a video player, an entertainment unit, and a set top box.

\* \* \* \* \*